Sept. 23, 1958 R. J. KIRCHER 2,853,615

CRYSTAL CONTROLLED TRANSISTOR OSCILLATOR SYSTEMS

Filed Nov. 1, 1957 2 Sheets-Sheet 1

REYMOND J. KIRCHER,
INVENTOR

BY Harold L. Jackson

ATTORNEY

CRYSTAL CONTROLLED TRANSISTOR OSCILLATOR SYSTEMS

Filed Nov. 1, 1957 2 Sheets-Sheet 2

REYMOND J. KIRCHER,
INVENTOR
BY Harold L Jackson
ATTORNEY

United States Patent Office 2,853,615

Patented Sept. 23, 1958

2,853,615

CRYSTAL CONTROLLED TRANSISTOR OSCILLATOR SYSTEMS

Reymond J. Kircher, Los Angeles, Calif., assignor to Hughes Aircraft Company, Culver City, Calif., a corporation of Delaware Application November 1, 1957, Serial No. 693,903

5 Claims. (Cl. 250—36)

The present invention relates to crystal-controlled oscillator systems, and more particularly to a means for varying the amplitude of oscillations of such a system in accordance with a control signal.

The present invention is useful in a variety of applications where it is desired to control the amplitude of a high frequency signal. For instance, the present invention may be utilized to provide an amplitude-modulated radio-frequency signal or may be used in connection with an appropriate feedback network to provide a high frequency oscillator system having a constant amplitude of oscillations.

It is an object of the present invention to provide means for varying the amplitude of oscillatons of a crystal-controlled transistor oscillator in accordance with the amplitude of a control voltage.

It is a further object of the present invention to provide an oscillator system including a crystal-controlled transistor oscillator circuit of the regenerative feedback type and a transistor control circuit coupled to the oscillator circuit for varying the amplitude of oscillations thereof wherein the oscillation frequency is substantially unaffected by the oscillation amplitude.

In accordance with the present invention, an oscillator system having a variable oscillation amplitude is provided which comprises a crystal-controlled transistor oscillator circuit of the regenerative feedback type and a transistor control circuit. The oscillator circuit includes an oscillator transistor having input, output and common electrodes and a parallel resonant circuit connected between the output and common electrodes of the oscillator transistor. A piezo-electric crystal is coupled between the parallel resonant circuit and the input electrode of the oscillator transistor for stabilizing the frequency of oscillations. The control transistor includes input, output and common electrodes, the input and output electrodes thereof being coupled across the input and output electrodes of the oscillator transistor, whereby the amplitude of oscillation is varied in accordance with the amplitude of a control voltage applied across the input and common electrodes of the control transistor.

The novel features which are believed to be characteristic of the invention both as to its organization and method of operation, together with further objects and advantages thereof, will be better understood from the following description considered in connection with the accompanying drawings in which.

Figure 1:
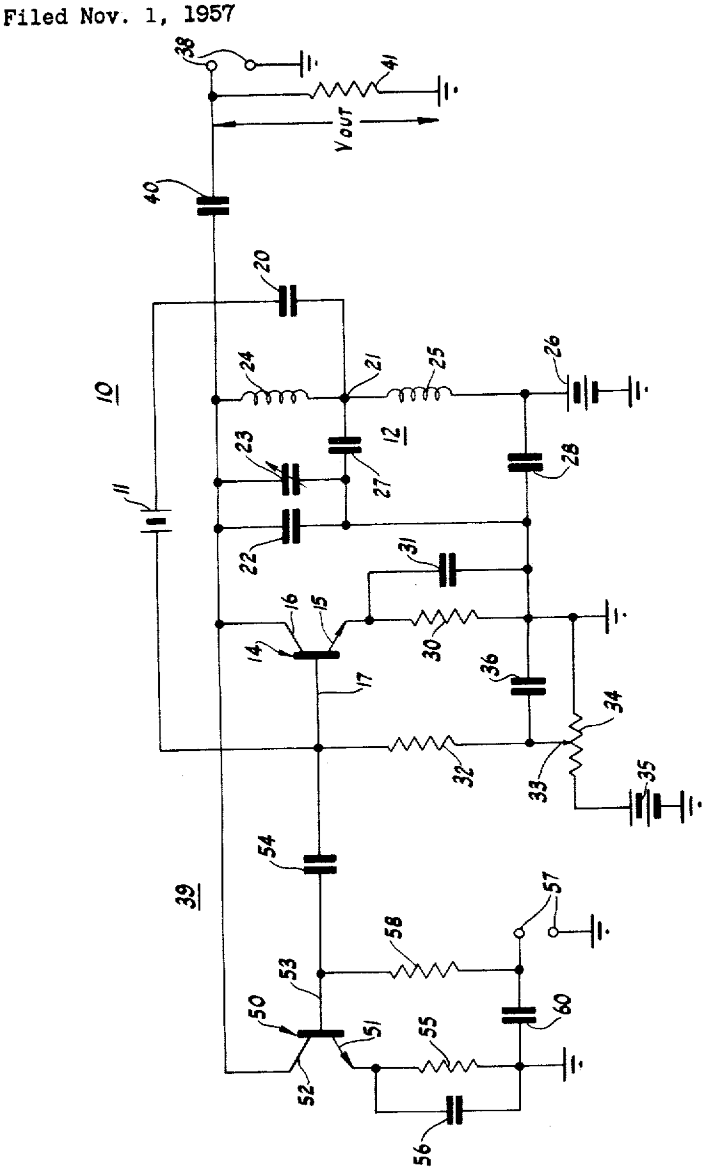
Fig. 1 is a schematic circuit diagram of an oscillator system utilizing the principles of the present invention.

Referring now to the drawings, and more particularly to Fig. 1 thereof, an oscillator circuit indicated generally as 10 which is of the regenerative feedback type includes a piezoelectric crystal control element 11, a parallel resonant tank circuit 12 and an oscillator transistor 14 connected in a grounded emitter configuration. The transistor 14 is for example shown as of the N-P-N junction variety, and includes a common or emitter electrode 15, an output or collector electrode 16, and an input or base electrode 17. The oscillator 10 is similar to a Hartley-type oscillator wherein the regenerative feedback path includes the crystal element 11 and a capacitor 20 connected in series between a point 21 in the tank circuit 12 and the base electrode 17 of the oscillator transistor 14. The tank circuit 12 comprises a pair of capacitors 22 and 23 connected in parallel between the collector electrode 16 and ground, the capacitor 23 being adjustable to permit tuning of the tank circuit. Two inductors 24 and 25 are also included in the tank circuit and are connected in series between the collector 16 and the positive terminal of a battery 26, the other terminal of which is connected to ground.

Another capacitor 27 is connected between the junction of the inductors 24 and 25 and ground to complete the tank circuit 12. A by-pass capacitor 28 is connected between the positive terminal of the battery 26 and ground. An emitter resistor 30 and a by-pass capacitor 31 are connected in parallel between the emitter 15 and ground to complete the emitter circuit of the transistor 14. The by-pass capacitor 31 provides a low impedance for the alternating current signals appearing at the emitter 15. A base bias resistor 32 is connected between the base 17 and the movable tap 33 of a potentiometer 34 which is connected between the positive terminal of a battery 35 and ground. While a separate battery 35 is illustrated as supplying the base-emitter bias of the transistor 14, the battery 26 could supply this base bias. A by-pass capacitor 36 is connected between the tap 33 of the potentiometer 34 and ground. A pair of output terminals 38, one of which is connected to ground and the other being connected to the collector through a coupling capacitor 40 are provided for deriving an output signal from the oscillator 10. A load resistor 41 may be connected across the output terminals 38 for developing the output signal thereacross.

In the operation of the oscillator circuit 10, the tank circuit 12 is initially adjusted by means of the capacitor 23 to oscillate at approximately the resonant frequency of the piezoelectric crystal 11. The oscillations are sustained by means of the feedback path which includes the stabilizing crystal 11 and which extends from the point 21 in the tank circuit to the base electrode 17 of the oscillator transistor. Since the grounded emitter circuit configuration of the oscillator transistor is characterized by a phase reversal between a signal applied to the base electrode 17 and the collector output signal, the signal appearing at the point 21 in the tank circuit has a component approximately 180 degrees out of phase with the collector output signal. A small additional phase shift occurs in the feedback path to provide a total phase shift of 180 degrees between the collector output signal and the signal applied to the base of the oscillator transistor to secure self-oscillations of the oscillator 10 at approximately the resonant frequency of the crystal 11.

To vary the amplitude of the oscillations or output signal from the oscillator, a control circuit generally indicated at 39 is connected in parallel with the oscillator transistor. This control circuit includes a control transistor 50 which may be of the N-P-N junction type. The transistor 50 is connected in a grounded emitter configuration and includes a common or emitter electrode 51, a collector or output electrode 52 and an input or base electrode 53. The base and collector electrodes of the control transistor 50 are connected in parallel or across the base and collector electrodes of the transistor 14, the two collector electrodes being connected directly together and the base electrodes being connected together through a blocking capacitor 54. The blocking capacitor 54 provides a low impedance for radio frequency signals and permits separate base-emitter bias conditions to be established for the transistors 14 and 50. The emitter circuit of the transistor 50 includes an emitter resistor 55 and a by-pass capacitor 56 connected in parallel between the emitter 51 and ground. A pair of input terminals 57, one of which is connected to ground, the other being connected to the base electrode 53 through a base bias resistor 58 are provided for controlling the base-emitter bias of the transistor 50 in accordance with the amplitude of an applied input signal to these input terminals. A decoupling capacitor 60 which may be connected across the input terminals 57 to provide a low impedance for high frequency signals appearing across the input terminals 57, The operation of the oscillator circuit 10 and the control circuit 39 is as follows. The oscillator circuit 10 oscillates at substantially the resonant frequency of the tank circuit; the oscillations being sustained by the regenerative feedback path as has been explained previously. Assuming that the control voltage applied to the input terminals 57 is zero or negative with respect to ground, the control transistor 50 is essentially nonconducting. At this time the oscillator transistor 14 is conducting and supplies the necessary power to the tank circuit 12 to sustain the oscillations in the system. Assume now that a positive voltage which may be direct current or a positive excursion of alternating current, is applied to the input terminals 57 and renders the control transistor 50 conducting. This control transistor draws additional current through the tank circuit 12 in phase with the current flowing through the oscillator transistor 14. This additional current increases the amplitude of oscillations that are produced across the tank circuit 12 or impressed across the output terminals 38. The maximum control voltage that may be effectively applied to the input terminals 57 depends, of course, on the value of the emitter resistor 55. Where the value of this resistor is approximately 1,000 ohms, the control voltage may vary between zero and approximately 2.5 volts to provide an approximately linear variation in the amplitude of the oscillations induced across the tank circuit 12. The maximum amplitude of control voltage should not exceed that required to saturate the control transistor since the change of the amplitude of the oscillations or output voltage with respect to the amplitude of the control voltage is nonlinear for control voltages in excess of that required to saturate the transistor.

The control voltage as mentioned before may be a direct current or alternating current voltage and may be derived from many different types of sources; however, where this control voltage is an alternating current potential, the frequency thereof should be considerably less than the frequency of oscillation of the oscillator 10 as will be obvious. The alternating current may be superimposed on a suitable direct current to achieve the desired linearity of operation.

Figure 2:
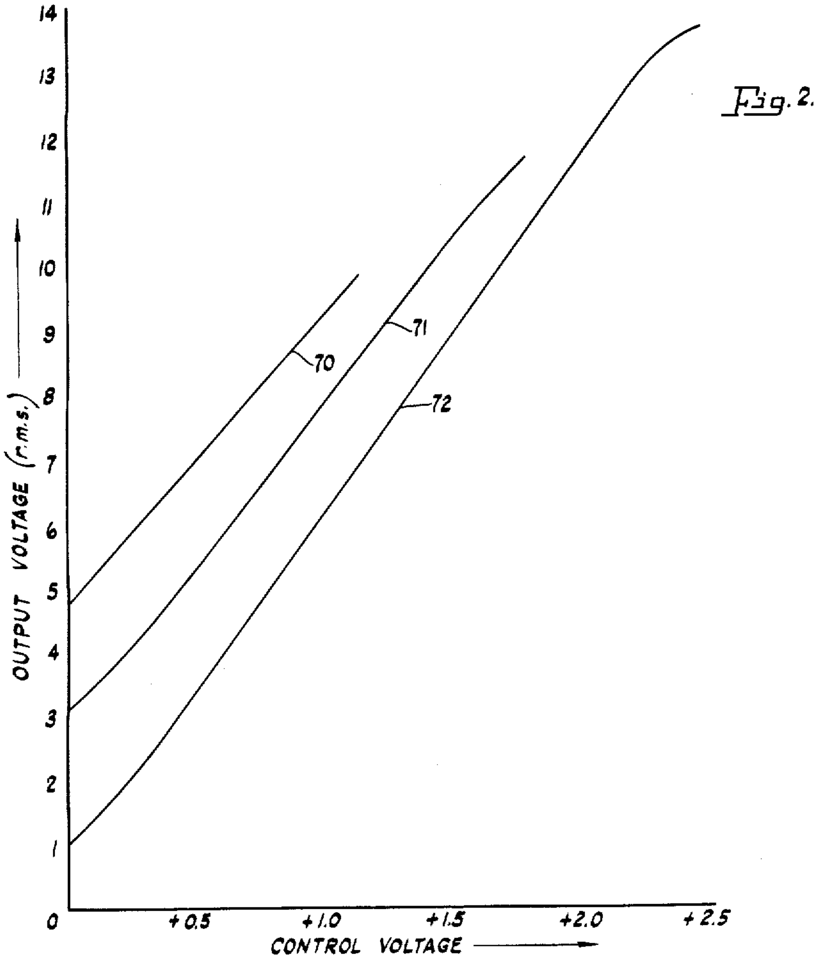
Fig. 2 is a graph illustrating the output voltage of the system of Fig. 1 for three different values of the oscillator transistor emitter current.

Referring now to the graph of Fig. 2, the ordinate represents the output voltage (root means squared or r. m. s.) across the terminals 38, and the abscissa represents the direct current control potential applied across the input terminals 57. The three curves of this figure, 70, 71 and 72, represent the variation of the output voltage appearing across the terminals 38 with respect to the value of the input control voltage with the emitter current flowing in the oscillator transistor 14 equal to .70 milliampere, .50 milliampere and .25 milliampere, respectively. As this graph discloses, the largest range of output voltage variation is achieved with the smallest emitter current flowing in the oscillator transistor (curve 72). It may be observed further from this figure that the input control voltage may vary between zero and approximately 2.5 volts, with the emitter current of the oscillator transistor equal to .25 milliampere, and for this particular control transistor emitter current and range of input control voltages, the output voltage developed by the oscillator 10 will vary between 1 volt r. m. s. and approximately 14 volts r. m. s.

Thus, where maximum linear output voltage variation is desired, the oscillator transistor 14 should be biased for as low an emitter current as is feasible for linear, stable operation.

Figure 3:
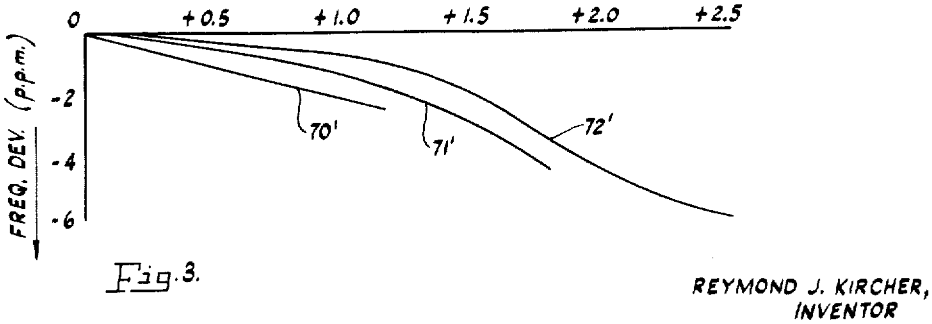
Fig. 3 is a graph illustrating the frequency deviation of the oscillator of Fig. 1 with respect to the amplitude of the base-emitter bias of the control transistor and for different oscillator transistor emitter currents.

The oscillation frequency of the oscillator circuit 10 is substantially unaffected by the amplitude modulation resulting from the control transistor 50, as may best be seen in Fig. 3, wherein the ordinate represents frequency deviation in parts per million (p. p. m.) and the abscissa represents the control voltage applied to the control terminals 57. Again, the three curves, 70', 71' and 72', of this graph represent the frequency deviation with respect to input control voltage with the emitter current flowing in the oscillator transistor equal to .70 milliampere, .50 milliampere and .25 milliampere, respectively. This figure illustrates that the smallest frequency deviation of the oscillation frequency occurs with the lowest emitter current flowing in the control transistor 14 (curve 72').

While it will be understood that the circuit specifications of the oscillator system of the present invention may vary according to the desired design for any particular application, the following circuit specifications for the circuit of Fig. 1 providing an oscillation frequency of approximately 100 kilocycles per second are included by way of example only.

| | |
|---|---|
| Transistors **14** and **50** | Type 904A manufactured by the Texas Instrument Company. |
| Batteries **26** and **35** | +20 volts. |
| Inductors **24** and **25** | Type NCR-50-1, 10 millihenrys, three-section choke, the element **24** comprising two sections or approximately 6.7 millihenrys, and the element **25** comprising one section or 3.3 millihenrys. |
| Resistors **30**, **32** and **58** | 10,000 ohms. |
| Resistor **41** | 8,200 ohms. |
| Resistor **55** | 1,000 ohms. |
| Resistor **34** | 20,000 ohms potentiometer. |
| Capacitors **31**, **28**, **60** and **56** | .1 microfarad. |
| Capacitor **22** | 500 micro-microfarads. |
| Capacitor **23** | 7–45 micro-microfarads, trimmer capacitor. |
| Capacitor **20** | 500 micro-microfarads. |
| Capacitor **40** | .01 microfarad. |
| Crystal **11** | Quartz crystal having a resonant frequency of 100 kilocycles type BH9A, x+ 5° cut, manufactured by the Bliley Company. |

It should be noted that while the oscillator and control transistors have been illustrated in grounded emitter configurations these transistors could be connected in other configurations such as grounded base and so forth to provide an oscillator system employing the principles of the present invention. For instance, when the oscillator transistor is connected in a grounded emitter configuration as is illustrated in Fig. 1, the control transistor could be connected in a grounded base configuration with the collector electrodes of the transistors being connected together and the emitter electrode of the control transistor being coupled by means of a suitable phase inverting network to the base electrode of the oscillator transistor. Also, the oscillator transistor could be connected in a grounded base configuration with the tank circuit being coupled between the collector and base electrodes thereof and the feedback path extending from the tank circuit to the emitter electrode thereof. Where the oscillator transistor is connected in this grounded base configuration, the control transistor could also be connected in a grounded base configuration with the collector electrodes of the two transistors being connected directly together and the emitter electrodes thereof being coupled together through a suitable blocking capacitor.

There has thus been disclosed an oscillator system which includes a crystal-controlled transistor oscillator circuit and a control transistor for providing an oscillator having a variable amplitude and a substantially constant frequency of oscillations.

What is claimed is:

1. An oscillator system comprising: an oscillator circuit of the regenerative feedback type including an oscillator transistor having input, output and common electrodes; a resonant tank circuit connected between the output electrode of said oscillator transistor and a point of fixed potential; a piezoelectric crystal coupled between said parallel resonant circuit and the input electrode of said oscillator transistor to provide a frequency selective regenerative feedback path; a control transistor having input, output and common electrodes; first circuit means connecting the output and common electrodes of said control transistor across said parallel resonant circuit; second circuit means coupled between the input electrodes of said transistors; and input means coupled to the input and common electrodes of said control transistor for applying a control voltage thereacross to vary the amplitude of oscillations of said oscillator circuit.

2. An oscillator system for varying the amplitude of oscillations developed by the system without substantially affecting the frequency thereof, said system comprising: an oscillator circuit including an oscillator transistor having input, output and control electrodes, a resonant tank circuit coupled to said output electrode, a current feedback path including a piezoelectric crystal coupled between said resonant tank circuit and said input electrode to provide a low impedance regenerative feedback path for currents at a predetermined frequency, said resonant circuit being tuned substantially to said predetermined frequency, and means coupled to the electrodes of said oscillator transistor for biasing said transistor to conduct, whereby oscillations substantially at said predetermined frequency will be developed; and apparatus for controlling the amplitude of said oscillations including a control transistor having input, output and common electrodes, first circuit means coupling the output and common electrodes of said control transistor across said resonant tank circuit, second circuit means coupling the input electrodes of said transistors, and third circuit means coupled to the input and common electrodes of said control transistor for applying a control voltage thereto, whereby the effective load coupled to said resonant tank circuit may be varied to vary the amplitude of said oscillations without substantially affecting the frequency of said oscillations.

3. An oscillator system for varying the amplitude of oscillations without substantially varying the frequency thereof comprising: an oscillator circuit including a first transistor having base, emitter and collector electrodes; a parallel resonant circuit connected in series relationship with said collector electrode; a current feedback path of relatively low impedance at a predetermined frequency coupled between said parallel resonant circuit and said base electrode for stabilizing the frequency of oscillation at said predetermined frequency, said path including a piezo-electric crystal; a second transistor having input, output and common electrodes; first circuit means coupling said output electrode to said collector electrode; second circuit means coupling said input electrode to said base electrode; and means coupled to said input and common electrodes for applying a control voltage thereacross to vary the amplitude of oscillations of said oscillator circuit.

4. An oscillator system comprising: an oscillator circuit including an oscillator transistor having base, emitter and collector electrodes; a parallel resonant circuit connected between the collector and emitter electrodes of said oscillator transistor; a current feedback path of relatively low impedance at a predetermined frequency coupled between said parallel resonant circuit and the base electrode of said oscillator transistor for stabilizing the frequency of oscillations, said path including a piezoelectric crystal; a control transistor having base, emitter and collector electrodes; direct-current conductive means coupled between the collector electrodes of said transistors; alternating-current conductive means coupled between the base electrodes of said transistors; means connecting the emitter electrodes of each of said transistors to a point of fixed potential; and input means connected between the base and emitter electrodes of said control transistor for applying a control voltage thereacross to vary the amplitude of oscillations of said oscillator circuit.

5. An oscillator system for varying the amplitude of oscillations without substantially varying the frequency thereof comprising: an oscillator circuit including an oscillator transistor having base, emitter and collector electrodes; a parallel resonant circuit connected between the collector electrode of said oscillator transistor and a point of fixed potential; a current feedback path of relatively low impedance at a predetermined frequency coupled between said parallel resonant circuit and the base electrode of said control transistor for stabilizing the frequency of oscillations, said path including a piezoelectric crystal; a first impedance element connected between the emitter electrode of said oscillator transistor and said point of fixed potential; means for biasing the base and emitter electrodes of said oscillator transistor in the forward direction to render said oscillator transistor conducting, whereby the oscillator transistor will oscillate at a frequency determined by said parallel resonant circuit and said piezoelectric crystal; a control transistor including base, emitter and collector electrodes, the collector electrode of said control transistor being connected directly to the collector electrode of said oscillator transistor; a first capacitor connected between the base electrodes of said transistors; a second impedance element connected between the emitter electrode of said control transistor and said point of fixed potential; a pair of input terminals; and circuit means connecting one of said input terminals to the base electrode of said control transistor, the other of said input electrodes being connected to said point of fixed potential.

References Cited in the file of this patent

UNITED STATES PATENTS 2,788,493 Zawels ---------------- Apr. 9, 1957